US009186758B2

(12) United States Patent
Henker et al.

(10) Patent No.: US 9,186,758 B2
(45) Date of Patent: Nov. 17, 2015

(54) METHOD FOR PRODUCING A TURBINE ROTOR OF AN EXHAUST GAS TURBOCHARGER, AND USE OF A TURBINE ROTOR

(71) Applicant: AUDI AG, Ingolstadt (DE)

(72) Inventors: Oliver Henker, Quitzdorf am See (DE); Anton Stich, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 14/376,783

(22) PCT Filed: Feb. 5, 2013

(86) PCT No.: PCT/EP2013/000339
§ 371 (c)(1),
(2) Date: Aug. 5, 2014

(87) PCT Pub. No.: WO2013/117316
PCT Pub. Date: Aug. 15, 2013

(65) Prior Publication Data
US 2014/0373354 A1    Dec. 25, 2014

(30) Foreign Application Priority Data

Feb. 6, 2012  (DE) .......................... 10 2012 002 284

(51) Int. Cl.
*B23P 15/00*        (2006.01)
*F01D 5/02*         (2006.01)
(Continued)

(52) U.S. Cl.
CPC ............... *B23P 15/006* (2013.01); *C23C 8/02* (2013.01); *C23C 8/04* (2013.01); *C23C 8/10* (2013.01); *C23C 14/081* (2013.01); *C23C 14/48* (2013.01); *C23C 14/56* (2013.01); *C23C 14/58* (2013.01); *C23C 14/5806* (2013.01); *C23C 14/5886* (2013.01); *F01D 5/025* (2013.01);
(Continued)

(58) Field of Classification Search
CPC . B23P 19/04; F05D 2230/60; Y10T 29/4932; Y10T 29/49316
See application file for complete search history.

(56) References Cited

U.S. PATENT DOCUMENTS

2006/0021221 A1*  2/2006  Decker ...................... 29/889.61
2008/0199313 A1*  8/2008  Nitta et al. ................. 415/216.1
2010/0247764 A1   9/2010  Watanabe et al.

FOREIGN PATENT DOCUMENTS

CN     102207008 A     10/2011
DE     102009034420    2/2011
(Continued)

OTHER PUBLICATIONS

A Donchev et al., The halogen effect for improving the oxidation resitance of TiAl alloys; Materials at High Temperatures, vol. 22, No. 3-4, Jan. 2005, pp. 309-314.*
(Continued)

*Primary Examiner* — Moshe Wilensky
(74) *Attorney, Agent, or Firm* — Henry M. Feiereisen LLC

(57) ABSTRACT

A method for producing a turbine rotor of an exhaust gas turbocharger, wherein the turbine rotor includes a turbine wheel with a hub and turbine blades that extend from the hub, and a shaft, includes the steps of: providing the turbine wheel and the shaft; forming a protective layer by applying or introducing a halogen on or in the surface of the turbine wheel and subsequently heat-treating the turbine wheel; and connecting the shaft to the hub of the turbine wheel after the protective coating is formed.

10 Claims, 2 Drawing Sheets

(51) Int. Cl.
- *F01D 5/28* (2006.01)
- *C23C 8/10* (2006.01)
- *C23C 14/08* (2006.01)
- *C23C 14/48* (2006.01)
- *C23C 14/56* (2006.01)
- *C23C 14/58* (2006.01)
- *C23C 8/02* (2006.01)
- *C23C 8/04* (2006.01)

(52) U.S. Cl.
CPC ........... *F01D 5/288* (2013.01); *F05D 2220/40* (2013.01); *F05D 2230/40* (2013.01); *F05D 2230/90* (2013.01); *F05D 2300/174* (2013.01); *F05D 2300/182* (2013.01); *Y10T 29/4932* (2015.01)

(56) References Cited

FOREIGN PATENT DOCUMENTS

| | | |
|---|---|---|
| EP | 1 462 537 | 9/2004 |
| EP | 1 621 774 | 2/2006 |
| EP | 2 204 466 | 7/2010 |
| JP | 2002-332569 | 11/2002 |
| WO | WO 2008/080633 | 7/2008 |

OTHER PUBLICATIONS

International Search Report issued by the European Patent Office in International Application PCT/EP2013/000339 on Mar. 25, 2013.

Chinese Search Report issued by the Chinese Patent Office on Mar. 23, 2015 in Chinese Patent Application No. 2013800081549.

English translation of Chinese Search Report issued by the Chinese Patent Office on Mar. 23, 2015 in Chinese Patent Application No. 2013800081549.

\* cited by examiner

METHOD FOR PRODUCING A TURBINE ROTOR OF AN EXHAUST GAS TURBOCHARGER, AND USE OF A TURBINE ROTOR

CROSS-REFERENCES TO RELATED APPLICATIONS

This application is the U.S. National Stage of International Application No. PCT/EP2013/000339, filed Feb. 5, 2013, which designated the United States and has been published as International Publication No. WO 2013/117316 and which claims the priority of German Patent Application, Serial No. 10 2012 002 284.0, filed Feb. 6, 2012, pursuant to 35 U.S.C. 119(a)-(d).

BACKGROUND OF THE INVENTION

The invention relates to a method for producing a turbine rotor of an exhaust gas turbocharger, wherein the turbine rotor is composed of a turbine wheel with a hub and turbine blades extending from the hub, as well as a shaft. The invention further relates to the use of a turbine rotor.

The response and the torque build-up, respectively, of an internal combustion engine supercharged by an exhaust gas turbocharger depend largely on the mass moment of inertia of the rotor assembly of the exhaust gas turbocharger and in particular on its turbine rotor. The major part of the mass moment of inertia is generated by the mass of the turbine wheel, which is part of the turbine rotor. The smaller the turbine wheel is, the quicker can the torque build-up take place. Accordingly, the response of the internal combustion engine can be improved by reducing the mass of the turbine wheel. One approach to reduce the mass of the turbine wheel is the replacement of the typically employed nickel base alloy, which has a density of about $8 \text{ g/cm}^3$, with a different material having a lower density. The material used for the turbine wheel has ideally high temperature properties, especially at temperatures exceeding 800° C., comparable to those of nickel-based alloys. However, materials which have the above properties, i.e. in particular a low density and good high temperature properties, are typically not resistant to oxidation at the temperatures of more than 800° C. that are present in the exhaust gas turbocharger due to the flow of hot exhaust gas from the internal combustion engine. This means that these materials are subjected to an oxidation process during the operation of the exhaust gas turbocharger, which adversely affects the surface of the turbine wheel. This applies in particular to the turbine blades, which are directly exposed to the hot exhaust gas, but in principle also to the hub on which the turbine blades are located.

SUMMARY OF THE INVENTION

It is therefore an object of the invention to provide a method for producing a turbine rotor of an exhaust gas turbocharger, which on the one hand is inexpensive to implement, and which on the other hand enables the production of a turbine rotor, which is resistant to oxidation even at the high temperatures that are present in the exhaust gas turbocharger. The turbine rotor, for example, should be made of a material that has a low density compared to conventional nickel-based alloys.

This is attained according to the invention by a method that includes the steps of: providing the turbine wheel and the shaft; forming a protective coating by applying or incorporating a halogen on or in the surface of the turbine wheel, preferably the entire surface, and subsequently heat treating the turbine wheel; and connecting the shaft to the hub of the turbine wheel. The turbine rotor is provided as a pre-manufactured turbine rotor. In other words, the turbine rotor is composed of the turbine wheel and the shaft, which are separately formed or produced. The shaft is then connected to the turbine wheel during manufacture of the turbine rotor, so that these two components then form a single unit in form of the turbine rotor. For this purpose, the turbine wheel and the shaft are initially provided. This provision may also include the manufacture, wherein the turbine wheel is manufactured in particular by casting.

After providing the turbine wheel, the protective coating is formed thereon. This is done by applying or introducing the halogen, whereby the (preferably entire) surface of the turbine wheel is treated with the halogen. It will be understood that the halogen can also be applied to or incorporated into only a portion of the surface. An area-wise application/introduction may only be provided particularly in the area of the hub. The halogen may be applied/introduced in any way. For example, an ion implantation process, a dip-coating process, a spray-coating process or a paint-coating process may be used. For example, a plasma immersion ion implantation process or a beam line ion implantation process or the like may be used as an ion implantation process for the ion implantation. In particular fluorine, chlorine, bromine, iodine or a mixture of these elements can be used as a halogen. The halogen should be applied or introduced, as already noted above, on or into the surface of the turbine wheel, but not the surface of the shaft.

After the application or introduction, the turbine wheel, in particular the entire turbine wheel, is subjected a heat treatment. This heat treatment, which may also be referred to as a thermal activation or pre-oxidation, is performed at at least 500° C. to 900° C. A thermally resistant protective coating is being formed during this heat treatment. This protects the turbine against excessive oxidation during operation of the exhaust gas turbocharger. After the protective coating has been formed, the shaft is connected to the hub of the turbine wheel, thereby producing the turbine rotor. The aforedescribed sequential order has the advantage that the shaft is connected to the turbine wheel only after the heat treatment of the turbine wheel. The shaft is thus not subjected to temperature during the heat treatment of the turbine wheel. This prevents an unacceptable oxidation of the shaft and/or prevents a possible coating of the shaft from disintegrating during the heat treatment of the turbine wheel. The connection between the shaft and the turbine wheel on the hub of the turbine wheel will also not be adversely affected by the heat treatment because the connection is produced only after the heat treatment.

According to a further development of the invention, the protective coating is at least partially removed from the hub prior to joining, in particular from only a wheel flange of the turbine wheel. Before the shaft is connected to the hub of the turbine wheel, the protective coating must be removed in the region where the connection or joint is to be made, in order to enable a reliable and durable connection between the shaft and the hub. The protective coating interferes with the production of the connection. Accordingly, the protective coating is removed from the hub, for example by machining at least a portion of the hub. Advantageously, the shaft may be attached to the hub only in the region of the wheel flange of the turbine wheel. For example, the hub has at that location a receptacle for the shaft and/or an attachment means of the shaft, which passes only through the wheel flange, but not through the opposite side of the hub. Therefore, the protective coating is advantageously removed exclusively from the wheel flange of the turbine wheel. The temperature load is typically relatively low at the wheel flange of the turbine. In particular, temperatures are present there during the operation of the exhaust gas turbocharger, which are lower than an oxidation temperature of the material of the turbine wheel or which would only cause negligible oxidation. Accordingly, the protective coating can be removed at this location, without the risk of an undesired or an undesirably strong oxidation during the operation of the exhaust gas turbocharger.

According to a further development of the invention, after connection, the protective coating is removed from the hub front face of the hub of the turbine wheel located opposite the wheel flange. The hub front face delimits the hub of the turbine wheel on the side opposite the wheel flange and is located—in relation to an axis of rotation of the turbine rotor—in the radial direction between the opposing turbine blades or around the axis of rotation. Whereas the turbine blades are subjected to a high temperature load during operation of the exhaust gas turbocharger due to exposure to the hot exhaust gas, this is usually not the case at all or only to a reduced extent for the wheel flange. The protective coating is removed from the hub front face after joining, i.e. usually as part of finish-machining of the turbine rotor.

Finish-machining may also include balancing of the turbine rotor. Removal of at least a portion of the material at the hub front face of the hub and thus of the protective coating is thus used, for example, to balance the turbine rotor. The hub is often formed in the region of the hub front face as a polyhedron or a polygon, which serves in particular to maintain a rotational angular position of the turbine rotor during assembly of the exhaust gas turbocharger when using a tool matching the polyhedron. As already stated above, the temperature at the hub front face during operation of the exhaust gas turbocharger is typically lower than the oxidization temperature. Accordingly, the removal of the protective coating does not cause any problem. Furthermore, oxidation at the hub end side does not cause a loss of performance of the turbine rotor. Rather, the operation of the exhaust gas turbocharger will not be adversely affected.

According to a further development of the invention, after connection, the protective coating is removed from a blade front face facing away from the hub of at least one of the turbine blades of the turbine wheel. This is also performed for example as part of finish-machining or balancing of the turbine rotor. The blade front face is located on a free end of the turbine blade, which is facing away from the hub. The protective coating is usually removed in this region also by mechanical processing, for example by grinding. A portion of the material of the turbine blade is hereby abraded on its blade front face.

According to a further development of the invention, the protective coating is formed once more at the blade front end by renewed heat-treating. The protective coating is, as stated above, produced or formed by applying or incorporating the halogen and then heat treating the turbine wheel. Subsequently, the protective coating is at least partially removed from the blade front face, for example as part of the finish-machining, i.e. after connecting the shaft to the hub of the turbine wheel. Because during operation of the exhaust gas turbocharger, the turbine blades are usually subjected to temperatures above the oxidation temperature of the material of the turbine wheel, the material of the turbine wheel can oxidize after the protective coating has been removed. For this reason, at least the blade front face is subjected of a new heat treatment by which the protective coating is formed again.

This heat treatment may also be performed in situ, i.e. in the exhaust gas turbocharger during operation. This heat treatment involves high temperatures, which in conjunction with the halogen that is still present in or on the surface of the turbine wheel can cause a renewed formation of the protective coating. Accordingly, the turbine wheel oxidizes only at the beginning of operation of the exhaust gas turbocharger. However, oxidation is prevented after the renewed formation of the protective coating. Preferably, it must be ensured during the removal of the protective coating at the blade front face that the machining depth does not exceed the depth of penetration of the halogen into the surface of the turbine wheel. In addition, the (first) heat treatment is carried out in such a way, for example by appropriate selection of the temperature and/or the duration, that not the entire amount of introduced or applied of the halogen is consumed for the oxidation. In this way, a sufficient amount of the halogen remains on or in the surface of the turbine wheel. Furthermore, halogen may again be applied on or introduced into the regions from which the protective coating was removed. in a particularly preferred embodiment, halogen is applied exclusively to these regions.

According to a further development of the invention, the turbine wheel may be made of a titanium-aluminum alloy, in particular a titanium aluminide. In the conventional embodiment, the turbine wheel is made of a nickel-based alloy which has a density of about 8 g/cm$^3$. As explained above, it is useful to reduce the mass of the turbine rotor, in particular of the turbine wheel, as much as possible in order to reduce to the mass inertia. The titanium-aluminum alloy is particularly suitable for this purpose because of its significantly lower density. Particularly preferred, the titanium-aluminum alloy is present as titanium aluminide (TiAl). The titanium-aluminum alloy has a density of about 4 g/cm$^3$. By applying the halogen on the surface of the turbine wheel made of the titanium-aluminum alloy, a heat-resistant $Al_2O_3$ layer is formed in the subsequent heat treatment. This protects the titanium-aluminum alloy, in particular the titanium aluminide, against impermissible oxidation during the operation of the exhaust gas turbocharger.

According to a further development of the invention, the shaft may be made of steel. The shaft is composed in particular of a material different from the material of the turbine wheel. For example, steel is used for obtaining good endurance strength of the turbine rotor. This steel is preferably hardened or tempered. To protect the shaft against unwanted temperature loading and a related dissolution of the coating, the shaft is connected to the hub of the turbine wheel only after the formation of the protective coating. An exception to this is the renewed heat treatment, which takes place for example during the operation of the exhaust gas turbocharger. Hereby, the temperatures that usually occur at the shaft do not adversely affect the protective coating of the shaft.

According to a further development of the invention, the heat treatment may take place at a temperature of at least 500° C. to at least 900° C. Preferably, the heat treatment is performed at a temperature that corresponds to the maximum temperature expected during the operation of the exhaust gas turbocharger. This prevents further, even slight oxidation immediately after the start-up of the exhaust gas turbocharger.

According to a further development of the invention, at least one bearing location of the shaft may be hardened subsequent to the connection. The shaft or the bearing location is usually hardened subsequent to making the connection, but before the finish-machining or the balancing of the turbine rotor.

The invention further relates to the use of a turbine rotor produced according to the above description. The use is contemplated in an exhaust gas turbocharger exposed to exhaust gas, wherein a temperature present at least in a region of the exhaust gas turbocharger exceeds an oxidation temperature of the material of a turbine wheel of the turbine rotor. For example, temperatures of greater than 800° C. exist at least in certain regions of the exhaust gas turbocharger. In this way, the renewed heat treatment can be used in particular to again form the protective coating on a blade front face. It will be understood that the exhaust gas turbocharger can be further developed in accordance with the above description.

BRIEF DESCRIPTION OF THE DRAWING

The invention will now be explained in more detail with reference to the exemplary embodiments illustrated in the drawings, without limiting the scope of the invention. In the drawings show in.

DETAILED DESCRIPTION OF PREFERRED EMBODIMENTS

Figure 1:
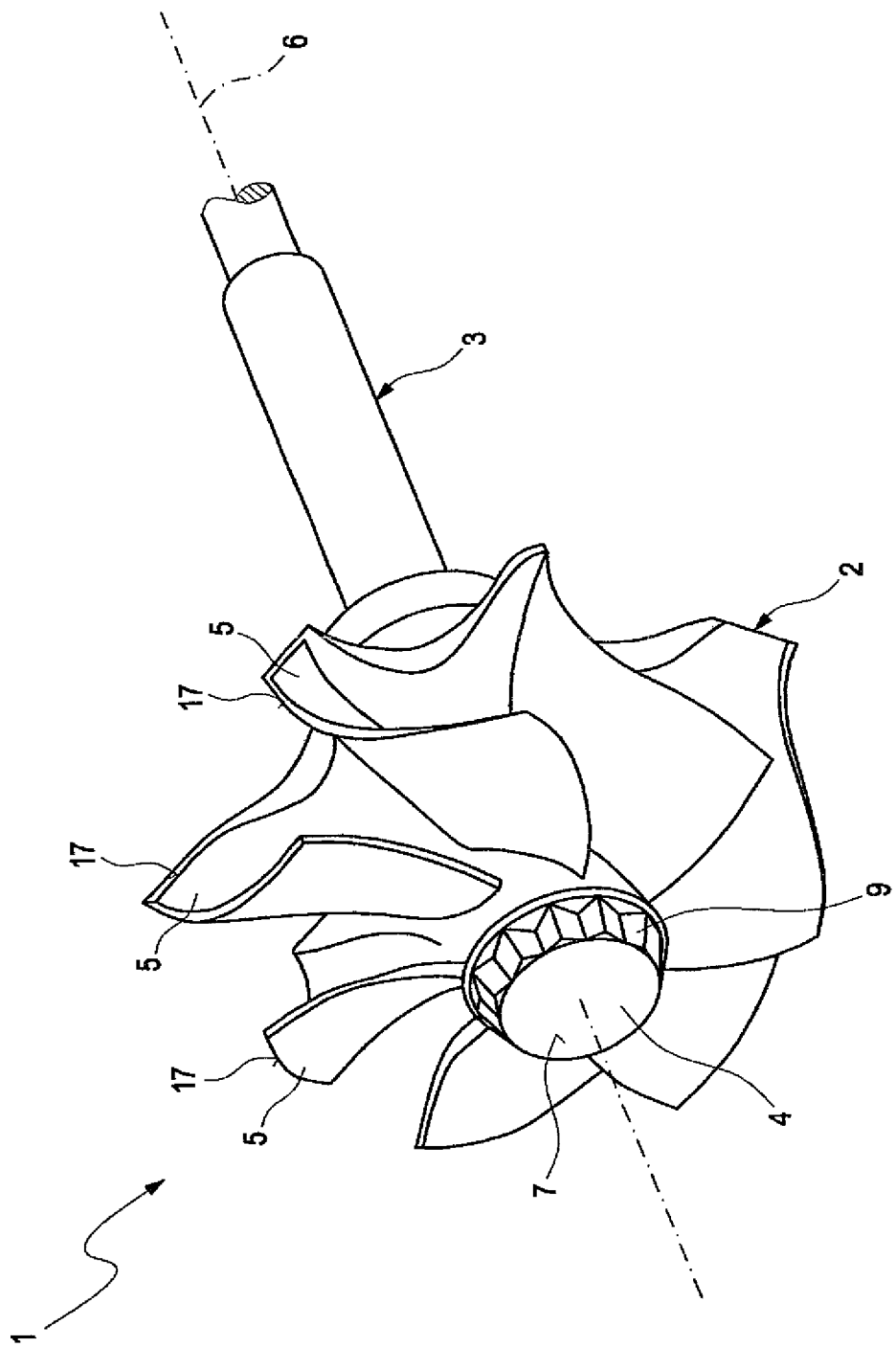
FIG. 1 a schematic diagram of a turbine rotor of an exhaust gas turbocharger which has a turbine wheel with a hub and turbine blades extending from the hub, and a shaft, and FIG. 2 a longitudinal section through the turbine rotor.

FIG. 1 shows a turbine rotor 1 of an unillustrated exhaust gas turbocharger. The turbine rotor 1 includes a turbine wheel 2 and a shaft 3. The turbine rotor 1 is part of the exhaust gas turbocharger which is associated with an internal combustion engine. The turbine rotor 1 is normally rotatably mounted in a turbine housing, wherein an impeller of a compressor is operatively connected with the turbine wheel 2 via the shaft 3. The turbine wheel 2 is composed of a hub 4 and a plurality of turbine blades 5, of which only some turbine blades are labeled with reference numerals by way of example. The turbine blades 5 extend starting from the hub 4—in relation to a rotational axis 6 of the turbine rotor 1—outward in a radial direction. The turbine wheel 2 is, for example, made of an aluminum alloy, for example a titanium-aluminum alloy, in particular a titanium aluminide. Conversely, the shaft 3 is made of steel, for example, a low-alloy steel, in particular 34CrMo4. The shaft 3 is rigidly affixed to the hub 4 of the turbine wheel 2. The hub is formed as a polyhedron or polygon 9 in the region a hub front face 7, which is located in the axial direction opposite to a wheel flange 8 (not visible) of the turbine wheel 2. This polyhedron 9 is used, in particular, to securely hold the turbine wheel 2 and the turbine rotor 1 during assembly of the exhaust gas turbocharger.

Figure 2:
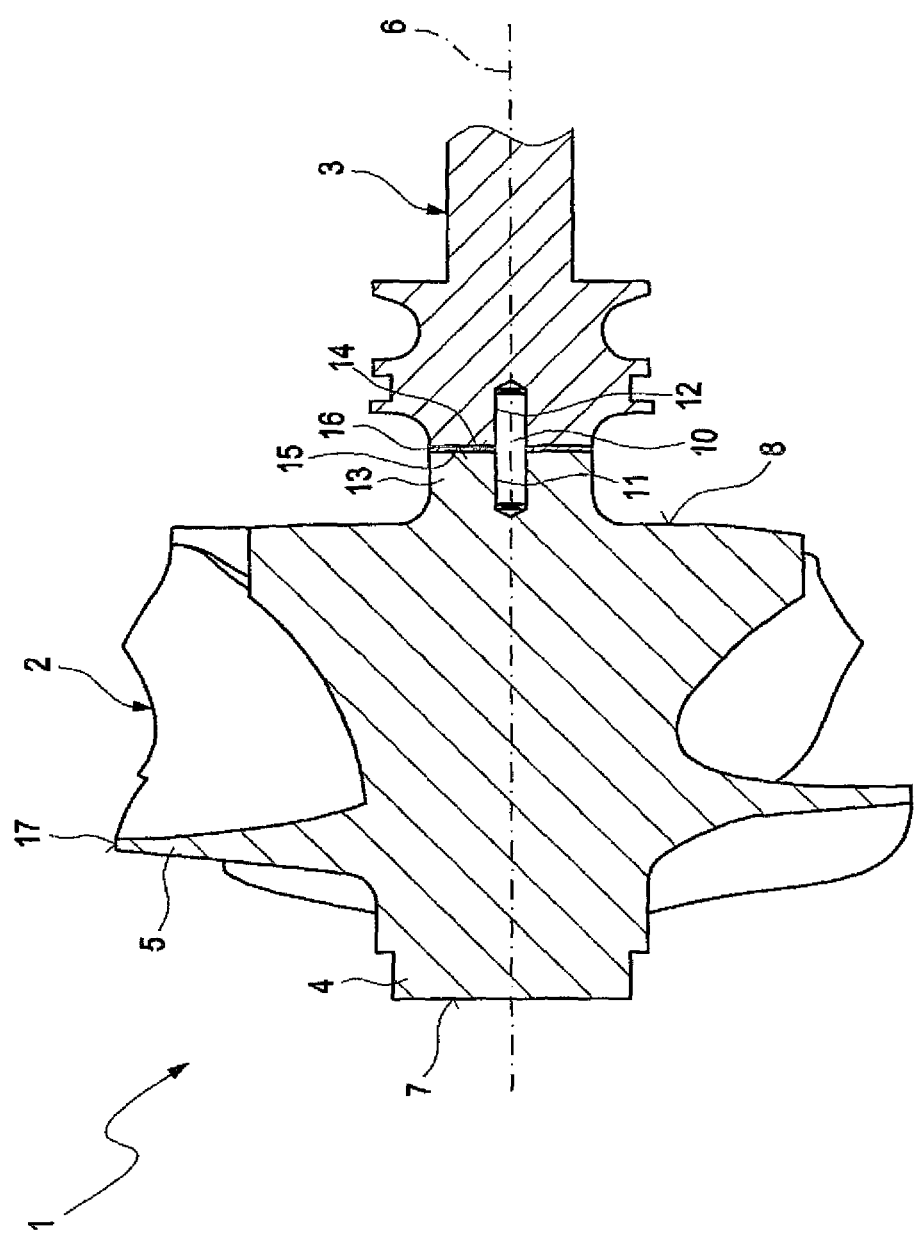

FIG. 2 shows a longitudinal section of the turbine rotor 1. The turbine wheel 2 and the shaft 3 are again discernible. It is evident that the turbine wheel 2 and the shaft 3 are connected to each other by fastening means embodied as a centering pin 10, wherein the centering pin 10 engaged in a recess 11 of the turbine wheel 2 and a recess 12 of the shaft 3 in the axial direction. The recess 11 is at least partially located in a mounting boss 13 of the turbine wheel 2, which extends in the axial direction (with respect to the axis of rotation 6) starting from the wheel flange 8 in the direction of the shaft 3. The mounting boss has a front face 14 which is substantially parallel to a front face 15 located on a side of the shaft 3 facing the turbine wheel 2. The turbine wheel 2 and the shaft 3 have substantially identical or at least similar diameters in the region of the front faces 14 and 15 of the mounting boss 13. A solder film 16 may be provided between the front faces 14 and 15, by means of which a permanent connection between the turbine wheel 2 and the shaft is established.

When the turbine rotor 1 is produced, the turbine wheel 2 and the shaft 3 are usually manufactured separately. In particular, the turbine wheel 2 is manufactured by casting. During the manufacture of the turbine rotor 1 and after the turbine wheel 2 is cast, a joint of the turbine 2 at which the connection to the shaft 3 is subsequently made, as well as the wheel flange 8 are mechanically machined. Subsequently, the turbine wheel 2 is connected to the shaft 3 which was previously tempered to form the turbine rotor 1, whereby the shaft 3 is connected to the turbine wheel 2. Subsequently, at least one bearing location of the shaft 3 (not shown here) can be hardened. However, this is optional. The turbine rotor 1 is then finish-machined and balanced. Material is mechanically removed from the turbine rotor 1 for finish-machining and balancing, for example by grinding or the like. In particular, the polyhedron 9 and a blade front face 17 of at least one of the turbine blades 5 are re-ground. The blade front face 17 is formed at a free end of the turbine blade 5, which is located on the side of the turbine blade 5 facing away from hub 4.

Because the turbine rotor 1 is subjected to a high temperature during operation of the exhaust gas turbocharger, i.e. is subjected a high temperature load, the turbine wheel 2 must be provided with a protective coating which is not shown in detail. This is especially provided when the turbine wheel 2 is made of the titanium-aluminum alloy, for example titanium aluminide. In this case, it is particularly important to protect the turbine wheel 2 from unwanted oxidation caused by the high temperature load. The coating is produced by first applying or introducing a halogen on or in at least a portion of the surface of the turbine wheel 2, in particular on or in the entire surface. Subsequently, the turbine wheel 2 is heat-treated to form the protective coating.

If this heat treatment is performed after the shaft 3 has been connected to the turbine wheel 2, then the shaft 3 is subjected to an undesired thermal load by which, for example, a potentially existing protective coating of the shaft 3 may be dissolved and/or to an undesirable oxidation may occur. For this reason, the production of the turbine rotor 1 should proceed as follows: First, the turbine wheel 2 and the shaft 3 are provided, wherein the two components are formed or manufactured separately. Thereafter, the halogen is introduced onto or into the surface of the turbine wheel 2 and only the turbine wheel 2 subsequently heat-treated. Only after the heat treatment is the shaft 3 connected to the turbine wheel 2 and the hub 4. To establish the connection, the protective coating is at least partially removed from the hub 4, in particular from the wheel flange 8, before the connection is made. In particular, the protective coating is removed only from the mounting boss 13, which is part of the hub 4, and in particular only from its front face 14 so as to allow a secure connection to the shaft 3. The shaft 3 is connected to the hub 4 in particular by using the solder film 16. However, other types of fastening methods may of course also be applied.

After the shaft 3 has been connected to the turbine 2, the shaft 3 or at least one bearing location of the shaft 3 is then—if desired—at least partially hardened. Subsequently, the turbine rotor 1 is finish-machined or balanced. To this end, material is removed from the finished turbine rotor 1, in particular in the area of the hub front face 7 or the polyhedron 9. Material is usually also removed from the blade end 17. Accordingly, the protective coating is again removed in these areas. Therefore, it is provided to again form the protective coating at the blade front face 17 by renewed heat treatment. This renewed heat treatment can be performed in particular by operating the exhaust gas turbocharger. The protective coating, in particular in the form of the $Al_2O_3$ protective coating, is hereby formed by the halogen still present in the turbine wheel 2. Accordingly, the protective coating is preferably removed from the blade front face 17 such that the machining depth is smaller than the penetration depth of the halogen in the material of the turbine wheel 2

The halogen may in principle be chosen arbitrarily. In particularly preferred applications, fluorine, chlorine, bromine, iodine or a mixture of these elements is used. Applying or introducing the halogen can be carried by an ion implantation process, a dip-coating process, a spray-coating process, a paint-coating process and the like.

The invention claimed is:

1. A method for producing a turbine rotor of an exhaust gas turbocharger, wherein the turbine rotor comprises a turbine wheel having a hub and turbine blades extending from the hub, and a shaft, the method comprising:
   providing the turbine wheel and the shaft;
   forming a protective coating by applying or incorporating a halogen on or in the surface the turbine wheel and thereafter heat treating the turbine wheel;
   removing the protective coating from the hub only from a wheel flange of the turbine wheel; and
   connecting the shaft to the hub of the turbine wheel after the protective coating has been formed on the turbine wheel and thereafter removed from the hub.

2. The method of claim 1, wherein prior to connecting, the protective coating is removed from the hub at least in some regions of the hub.

3. The method of claim 1, wherein after connecting, the protective coating is removed from a hub front face of the hub of the turbine wheel that faces the wheel flange.

4. The method of claim 1, wherein after connecting, the protective coating is removed from a hub front face of the hub of the turbine wheel that faces away from the wheel flange.

5. The method of claim 4, wherein the protective coating is formed again on the blade front face by renewed heat treatment.

6. The method of claim 1, wherein the turbine wheel is made of a titanium-aluminum alloy.

7. The method of claim 6, wherein the turbine wheel is made of titanium aluminide.

8. The method of claim 1, wherein the shaft is made of steel.

9. The method of claim 1, wherein the heat treating takes place at a temperature of at least 500° C. to at least 900° C.

10. The method of claim 1, wherein after connecting, at least one bearing of the shaft is hardened.

* * * * *